(12) United States Patent
Kaikkonen et al.

(10) Patent No.: US 9,998,234 B2
(45) Date of Patent: Jun. 12, 2018

(54) OPTICAL RECEIVER AND TRANSCEIVER USING THE SAME

(71) Applicant: FINISAR CORPORATION, Sunnyvale, CA (US)

(72) Inventors: Andrei Kaikkonen, Jaerfaella (SE); Lennart Per Olof Lundqvist, Jaerfaella (SE); Lars-Goete Svensson, Sollentuna (SE); Peter Lindberg, Uppsala (SE)

(73) Assignee: FINISAR CORPORATION, Sunnyvale, CA (US)

( * ) Notice: Subject to any disclaimer, the term of this patent is extended or adjusted under 35 U.S.C. 154(b) by 403 days.

(21) Appl. No.: 14/201,044

(22) Filed: Mar. 7, 2014

(65) Prior Publication Data

US 2014/0255042 A1 Sep. 11, 2014

(30) Foreign Application Priority Data

Mar. 7, 2013 (EP) .................................... 13158147

(51) Int. Cl.
*H04B 10/00* (2013.01)
*H05K 3/28* (2006.01)
*H04B 10/69* (2013.01)
*H04B 10/40* (2013.01)
(Continued)

(52) U.S. Cl.
CPC ........... *H04B 10/697* (2013.01); *H04B 10/40* (2013.01); *H05K 1/0243* (2013.01); *H05K 1/0253* (2013.01); *G02B 6/4249* (2013.01); *H05K 2201/10121* (2013.01)

(58) Field of Classification Search
CPC .... G02B 6/4249; H04B 10/40; H04B 10/697; H05K 1/0243; H05K 2201/10121; H05K 1/0253
USPC ........ 398/135, 138, 202, 211; 174/260, 255; 361/763, 817
See application file for complete search history.

(56) References Cited

U.S. PATENT DOCUMENTS 5,206,986 A * 5/1993 Arai .......................... G02B 6/42
174/266
5,401,957 A * 3/1995 Suzuki ................. H04B 10/299
250/227.21

(Continued)

OTHER PUBLICATIONS

Jin et al; Electromagnetic Crosstalk Penalty in Serial Fiber Optic Modules; 2004, IEEE,pp. 912-915.*

(Continued)

*Primary Examiner* — Amritbir Sandhu
(74) *Attorney, Agent, or Firm* — Maschoff Brennan

(57) ABSTRACT

An optical receiver is disclosed having a dielectric non-conductive substrate. A ground plane is positioned on the dielectric non-conductive substrate. An optical signal converting photodiode is also positioned on the dielectric non-conductive substrate, and has an optical signal receiver and an electrical signal output. An electrical signal amplifier is provided having an input connected to the electrical signal output of the optical signal converting photodiode. A first opening is positioned in the ground plane and surrounds the optical signal converting photodiode. The first opening has a resonance frequency higher than a fundamental frequency such that crosstalk is reducible at the input of the electrical signal amplifier.

20 Claims, 8 Drawing Sheets

(51) Int. Cl.
*H05K 1/02* (2006.01)
*G02B 6/42* (2006.01)

(56) References Cited

U.S. PATENT DOCUMENTS

| | | | | |
|---|---|---|---|---|
| 6,181,718 | B1* | 1/2001 | Kobayashi | H01S 5/02284 372/34 |
| 6,364,541 | B1* | 4/2002 | Nesnidal | G02B 6/4248 250/214.1 |
| 6,487,087 | B1* | 11/2002 | Langley | G02B 6/4201 361/736 |
| 6,538,790 | B1* | 3/2003 | Hatakeyama | H04B 10/69 398/202 |
| 7,423,483 | B1* | 9/2008 | Voo | H03F 1/08 330/109 |
| 7,427,718 | B2* | 9/2008 | Ng | H05K 1/0224 174/255 |
| 7,720,393 | B2* | 5/2010 | Hakomori | H01L 27/144 398/130 |
| 8,019,187 | B1* | 9/2011 | Dutta | G02B 6/122 385/133 |
| 8,154,901 | B1* | 4/2012 | Lee | H05K 1/0243 326/30 |
| 8,891,975 | B2* | 11/2014 | Yagisawa | H04B 10/6911 398/200 |
| 8,936,405 | B2* | 1/2015 | Tamura | H01L 23/66 385/88 |
| 9,814,153 | B2* | 11/2017 | Kaikkonen | H05K 7/026 |
| 2003/0081297 | A1* | 5/2003 | Hasegawa | G02B 6/4201 398/202 |
| 2004/0090289 | A1 | 5/2004 | Chang | |
| 2007/0264022 | A1* | 11/2007 | Hakomori | H01L 27/144 398/138 |
| 2008/0123302 | A1* | 5/2008 | Kawano | H04B 3/54 361/728 |
| 2008/0187321 | A1* | 8/2008 | Kawamura | H04B 10/40 398/139 |
| 2009/0003844 | A1* | 1/2009 | Adamiecki | H04B 10/69 398/202 |
| 2009/0196626 | A1* | 8/2009 | Nakao | G01J 1/02 398/135 |
| 2012/0070121 | A1* | 3/2012 | Ito | H01L 31/02019 385/88 |
| 2012/0098626 | A1* | 4/2012 | Oshima | H01P 1/20381 333/204 |
| 2012/0162932 | A1* | 6/2012 | Contreras | H05K 1/0224 361/748 |
| 2012/0170944 | A1 | 7/2012 | Yagisawa et al. | |
| 2012/0262885 | A1* | 10/2012 | Ikeda | H05K 1/0243 361/748 |
| 2014/0049343 | A1 | 2/2014 | Sakai | |
| 2014/0252612 | A1* | 9/2014 | Nakagawa | H01L 23/12 257/738 |
| 2015/0147066 | A1* | 5/2015 | Benjamin | H04B 10/25759 398/116 |
| 2015/0264803 | A1* | 9/2015 | Kaikkonen | H05K 1/0225 361/803 |
| 2015/0296648 | A1* | 10/2015 | Kaikkonen | H05K 1/025 250/208.2 |
| 2016/0070061 | A1* | 3/2016 | Fasano | G02B 6/122 385/14 |
| 2016/0154177 | A1* | 6/2016 | Han | G02B 6/4251 385/14 |
| 2017/0294720 | A1* | 10/2017 | Murakowski | H01Q 21/0037 |

OTHER PUBLICATIONS

Jin et al; Electromagnetic Crosstalk Penalty in Serial Fiber Optic Modules; 2004, IEEE; pp. 912-915.*
European Search Report, Application No. 13158147.2, dated Oct. 15, 2013, 6 pages.
Lars Dillner, Roger Loow, Elsy Odling, Eva Backlin and Thomas Aggerstam, GaAs PIN photo detectors for 10 Gbit/s data communication, Photodetector Materials and Devices VII, Proceedings of SPIE, vol. 4650 (2002), 5 pages.
N. Bar-Chaim, K.Y. Lau and I. Ury, A. Yariv, High-Speed GaAlAs/GaAs p-i-n photodiode on a semi-insulating GaAs substrate, Appl. Phys. Lett. 43 (3), Aug. 1, 1983, 2 pages.

* cited by examiner

OPTICAL RECEIVER AND TRANSCEIVER USING THE SAME

CROSS-REFERENCE TO RELATED APPLICATION

This application claims the benefit of the filing date under 35 U.S.C. § 119(a)-(d) of European Patent Application No. 13158147.2 filed Mar. 7, 2013.

FIELD OF THE INVENTION

The present invention relates to an optical receiver for receiving an optical signal, for converting the optical signal into an electric signal and for outputting the electrical signal. Particularly, the optical receiver is an optical data receiver for receiving data at a predetermined data rate. The present invention also relates to a transceiver including the optical receiver/optical data receiver of the present invention and a transmitter for receiving an electric signal, converting the electric signal into an optical signal and outputting the optical signal.

BACKGROUND

In order to support the communication requirements of high-speed data transmission applications at a bit rates of 25 Gpb, optical links are used when links through an electrical wire have a too low bandwidth. When using an optical link for transmitting an electrical signal from a first electronic component to a second electronic component, the electrical signal is first converted into an optical signal, then the optical signal is coupled into an optical fiber through an optical transmitter, and the optical signal is then transmitted to the second electronic component through the optical fiber. At the second electronic component, the optical signal is received by an optical receiver and converted back into an electrical signal. Then the converted electrical signal is further processed in the second electronic component.

FIG. 1 shows a conventional transceiver 100 for converting an electric signal into an optical signal and vice-versa. The transceiver 100 includes a dielectric, non-conductive substrate (not shown in FIG. 1), a ground plane 101 placed on the dielectric non-conductive substrate, an array of four drivers 102, an array of four laser diodes 103 such as vertical cavity surface emitting lasers (VCSEL) connected to respective outputs of the drivers 102, an array of four photodiodes 104 such as positive intrinsic negative diodes (PINs), and an array of four transimpedance amplifiers 105 (TIAs) connected to respective outputs of the photodiodes of the array of photodiodes 104. The array of drivers 102, the array of laser diodes 103, the array of photodiodes 104 and the array of TIAs 105 are all placed on the same dielectric non-conductive substrate and surrounded by the ground plane 101. Additionally, the array of photodiodes 104 is placed in the interior of an opening provided in the ground plane 101, so as to isolate the array of photodiodes 104 from the ground plane 101.

Each driver of the driver array 102 receives at its input (not shown in FIG. 1) an electric signal from, for instance, a motherboard of a computer (not shown in FIG. 1), converts the received electrical signal into a single ended electrical signal, and outputs this through output terminals 110 and 111 to inputs of a VCSEL of the VCSEL array 103. The output terminal 111 of a driver of the driver array 102 is connected through a ground line 113 to an input of a respective VCSEL of the VCSEL array 103. The output terminal 110 of a driver of the driver array 102 is connected through a signal line 112 to another input of the respective VCSEL. Each VCSEL of the VCSEL array 103 converts the single ended electrical signal received at its inputs to an optical signal, and outputs this to an optical fiber.

Each photodiode 114 of the array of photodiodes 104 receives an optical signal from an optical fiber (not shown in FIG. 1), converts the received optical signal into a single ended electrical signal, and outputs this through its anode 117 and its cathode 116 to the inputs of a respective TIA. The anode 117 of a photodiode of the array of photodiodes 104 is connected through a signal line 118 to an input of the respective TIA, and the cathode 116 of a photodiode of the array of photodiodes 104 is connected through a ground line 119 to another input of the respective TIA.

As the signal lines 112 connecting outputs of the driver array 102 with respective inputs of the VCSEL array 103 (Driver-VCSEL channels) and the signal lines connecting anodes 114 of the photodiode array 104 with respective inputs of the TIA array 105 (in the following denoted as PIN-TIA channels) are of single-end type, so single-end-type crosstalk occurs among these lines. The single-end type crosstalk occurs where there is a transfer of signal power from one or a plurality of signal lines (aggressor lines) to another signal line (victim line) through the common ground plane 101. At the victim line, crosstalk overlays with the signal carried by the victim line, thereby degrading its signal quality. Crosstalk can occur not only among Driver-VCSEL channels and among PIN-TIA channels, but also among Driver-VCSEL and PIN-TIA channels, if the array of photodiodes 104 is isolated from ground by the opening 115 provided in the ground plane 101.

The opening 115 formed in the ground plane 101 and surrounding the photodiode array 104 has a rectangular shape and a size of approximately 1 mm×0.4 mm. The size of the opening is mainly determined by the dimensions of the photodiode array 104 and cannot be reduced arbitrarily. At high frequencies, the opening 105 acts as a slot resonator whose fundamental frequency is determined by the geometric dimension of the opening 105. A rectangular opening having a size of 1 mm×0.4 mm has a resonant frequency of about 38 GHz. This is about 3×12.5 GHz, wherein 12.5 GHz is the fundamental frequency of the 25 Gbps data transmission. As the opening 115 acts as a slot resonator whose fundamental frequency is almost a multiple of the fundamental frequency of the 25 Gbps data transmission, the opening 115 attracts signal current output by drivers of the driver array 102. This resonant effect, which occurs at approximately 38 GHz, promotes crosstalk from Driver-VCSEL channels to PIN-TIA channels. Particularly, PIN-TIA channels that are placed near to the driver array 102 are affected by crosstalk coming from Driver-VCSEL channels.

FIG. 2 shows the principle s-parameter coupling coefficient 201 corresponding to the single end type crosstalk from the driver outputs of the driver array 102 to the input of the TIA closest to the driver array 102. This is obtained by simulation for the transceiver 100 having all Driver-VCSEL channels (aggressors) activated. The principle s-parameter coupling coefficient 201 exhibits a broad resonance 202 at 38 GHz due to the resonance effect of the opening 115. This resonance 202 induces crosstalk in the TIA input closest to the driver array 102. This crosstalk generates more than 6 ps or 0.15 UI Jitter in the EYE diagram for 25 Gbps, assuming a bit error rate (BER) of $10^{-12}$. This becomes evident from FIG. 3, which shows the EYE diagram corresponding to 25 Gbps, for the PIN-TIA channel closest to the driver array 102. The EYE diagram in FIG. 3 has been obtained by simulation under the conditions that the transceiver 100 has all four aggressor channels activated and the ratio between driver output and TIA input current is equal to 100, which corresponds to about −8 dBm optical receiver sensitivity. The outline 301 corresponds to a bit error rate of $10^{-12}$.

The resonant behavior of the opening 115 also promotes crosstalk among PIN-TIA channels. This increases with increasing number of photodiodes included in the array of photodiodes 104. When the photodiode array 104 includes 8 or 12 channels, the crosstalk level among PIN-TIA channels can reach an intolerable value.

For a photodiode array including twelve channels, the opening provided in the ground plane and surrounding the photodiode array exhibits a resonance at about 15 GHz. This resonance is close to the fundamental frequency (12.5 GHz) of the 25 Gbps data transmission and thus also promotes crosstalk, thereby degrading signal quality of the PIN-TIA channels.

Crosstalk in the PIN-TIA channels severely degrades the signal quality of the signals input to the TIA array 105, especially of those input to TIAs that are close to the driver array 102.

SUMMARY

It is therefore an object of the present invention to reduce crosstalk in the PIN-TIA channels of an optical receiver. An optical receiver is disclosed having a dielectric non-conductive substrate. A ground plane is positioned on the dielectric non-conductive substrate. An optical signal converting photodiode is also positioned on the dielectric non-conductive substrate, and has an optical signal receiver and an electrical signal output. An electrical signal amplifier is provided having an input connected to the electrical signal output of the optical signal converting photodiode. A first opening is positioned in the ground plane and surrounds the optical signal converting photodiode. The first opening has a resonance frequency higher than a fundamental frequency such that crosstalk is reducible at the input of the electrical signal amplifier.

BRIEF DESCRIPTION OF THE DRAWINGS

The invention will now be described by way of example with reference to the accompanying Figures, of which.

DETAILED DESCRIPTION OF THE EMBODIMENT(S)

Figure 4:
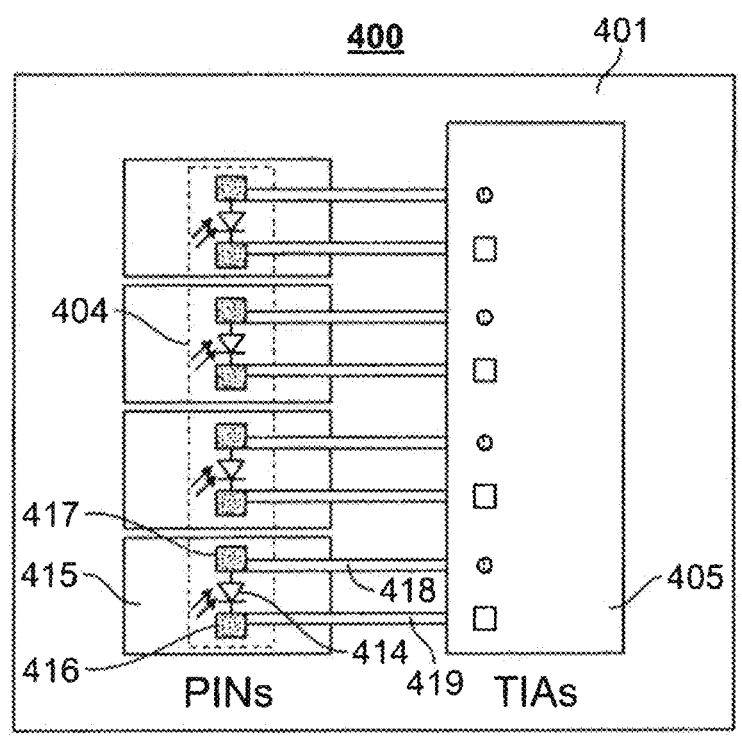
FIG. 4 shows a schematic of a first embodiment of an optical receiver.

FIG. 4 illustrates a first embodiment of an optical receiver 400 having a dielectric non-conductive substrate (not shown), a ground plane 401 positioned on the dielectric non-conductive substrate, an array of four photodiodes 404 (PINs), and an array of four amplifiers 405 (TIAs) connected to respective outputs of the photodiodes 414. The array of photodiodes 404 and the array of amplifiers 405 are placed on the dielectric non-conductive substrate and surrounded by the ground plane 401. Four openings 415 are provided in the ground plane 401. Each opening of the four openings 415 surrounds one photodiode 414 so as to isolate the respective photodiode from the ground plane.

Each photodiode 414 receives an optical signal from an optical fibre (not shown), converts the received optical signal into a single ended electrical signal, and outputs this through the photodiode's 414 anode 417 and cathode 416 to the inputs of a respective amplifier. The anode 417 of a photodiode 414 is connected through a signal line 418 to an input of the respective amplifier, and the cathode 416 of a photodiode of the array of photodiodes 404 is connected through a ground line 419 to another input of the respective amplifier.

Each opening 415 of the four openings has a rectangular shape and a size of approximately 0.3 mm×0.25 mm, so that its resonance frequency is sufficiently higher than 37.5 GHz, preferably 50 GHz or higher. Thus, for this embodiment, the sufficiently higher resonance frequency is achieved by setting the resonance frequency of the slot resonance to 50 GHz or higher. The minimal length of an opening 415 in the length's direction of the array of photodiodes 404 is determined by the dimensions of a photodiode 414, particularly by the distance between anode and cathode along the optical aperture, and cannot be reduced arbitrarily. As the resonant frequency of each opening 415 is higher than three times 12.5 GHz, which is the fundamental frequency of the 25 Gbps data transmission, the opening 415 does not act as a slot resonator with the fundamental frequency of 37.5 GHz. Consequently, the opening 415 does not attract signal current through the ground plane 401 if a 25 Gbps data transmitter is placed on the same non-conductive substrate.

Figure 1:
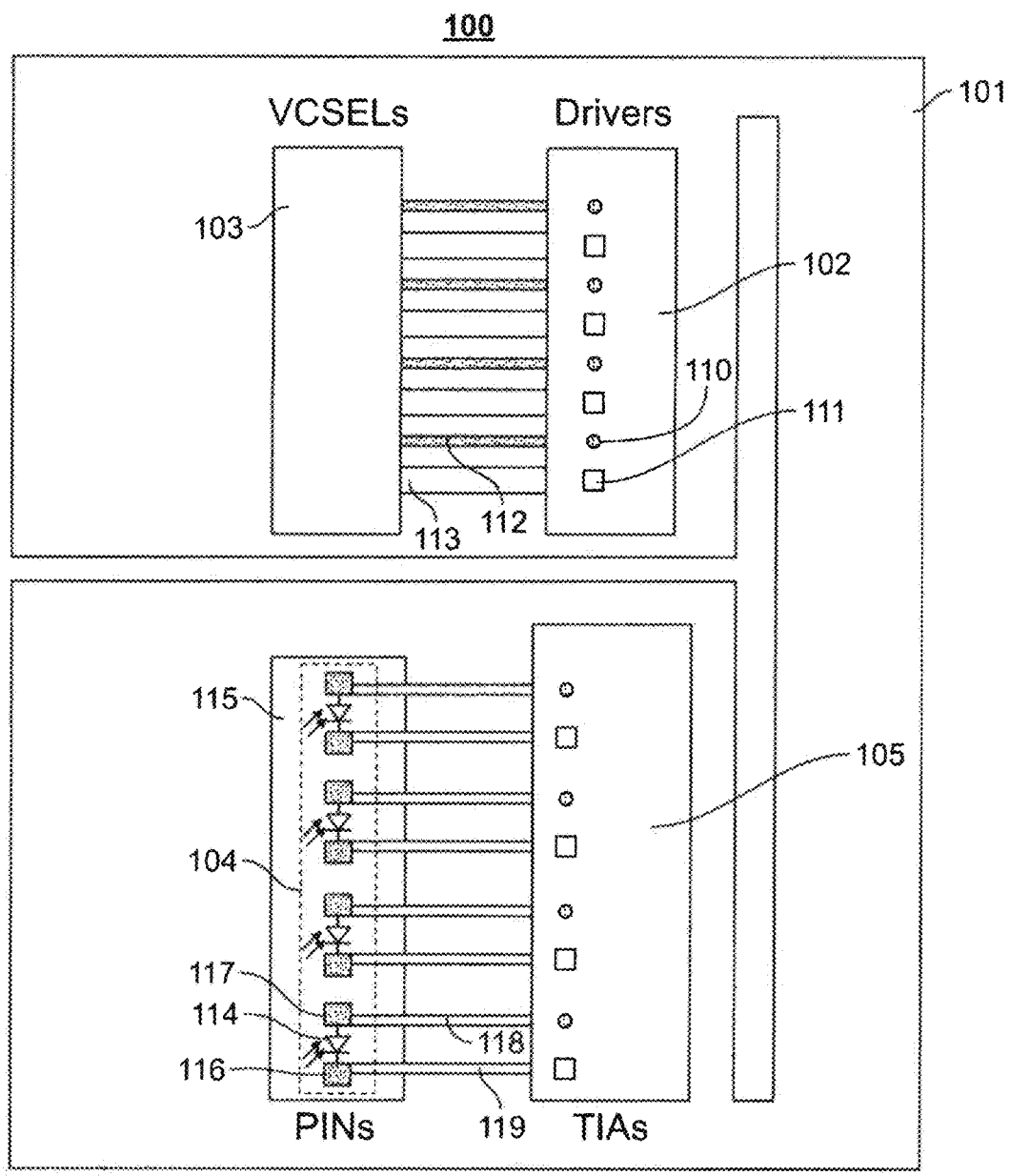
FIG. 1 shows a schematic of a conventional transceiver.

Since the openings 415 do not show a resonant effect at 37.5 GHz, crosstalk of an external signal with a fundamental frequency of 12.5 GHz into the signal line connecting the anode of a photodiode 414 and the input of a respective amplifier (PIN-TIA channels) is significantly reduced compared to the conventional transceiver 100 (FIG. 1).

The openings 415 also reduce crosstalk between individual PIN-TIA channels of the optical receiver 400 if the fundamental frequency of the signals output by the photodiodes of the array of photodiodes 404 is about 12.5 GHz.

Figure 5:
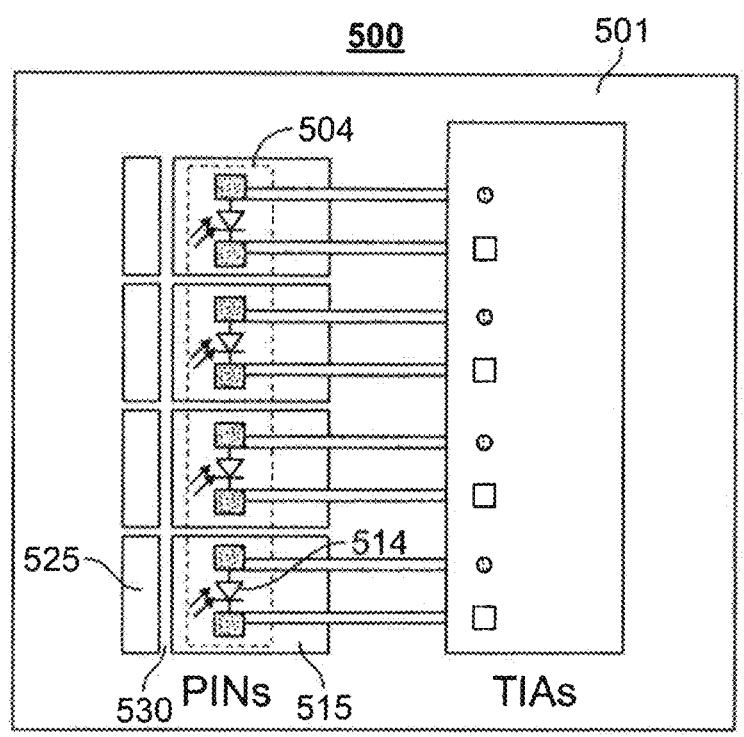
FIG. 5 shows a schematic of a second embodiment of an optical receiver.

Referring now to FIG. 5, a second embodiment of an optical receiver 500 is shown where each opening 415 of the optical receiver 400 in the first embodiment is divided into a first opening 515 and a second opening 525 in a ground plane 501. The first opening 515 and the second opening 525 are separated from each other by a grounding strip 530 connected to the ground plane 501 at both ends. A photodiode 514 of the array of photodiodes 504 is positioned in the first opening 515. The second opening 525 is adjacent to the first opening 515. The area of a second opening 525 is smaller than the area of the corresponding first opening 515.

As discussed above, the opening 415 of the optical receiver 400 in the first embodiment has a resonance frequency that is higher than three times a predetermined fundamental frequency. The first opening 515 and the second opening 525 of the optical receiver 500 in the second embodiment have resonant frequencies that are also higher than three times the predetermined fundamental frequency.

Although the ground plane 501 of the optical receiver 500 includes a first opening 515 and a second opening 525 for each photodiode 514, one of ordinary skill in the art would also understand that the first opening 515 and the second opening 525 combination can be positioned in the ground plane 501 for a one or more of the photodiodes 514 of the array of photodiodes 504. Further, the first opening 515 and the second opening 525 can be used on one or more of the photodiodes 514 in combination with just the first opening 415 on one or more of the photodiodes 514.

Placing a second opening 525 adjacent to a first opening 515 that surrounds a photodiode 514 of the array of photodiodes 504, reduces crosstalk in the PIN-TIA channels of the optical receiver effectively.

Figure 6:
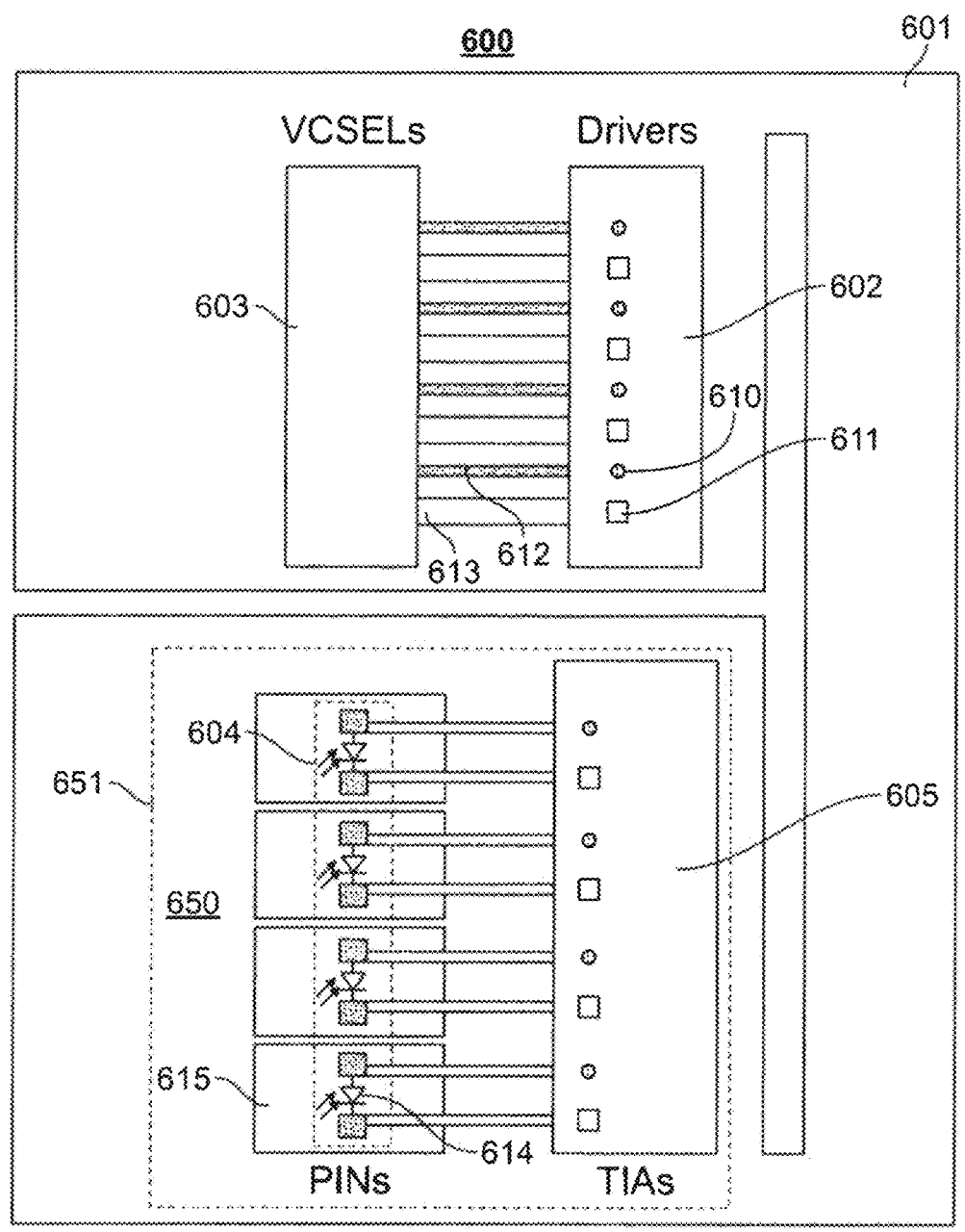
FIG. 6 shows a schematic of a transceiver having the optical receiver of FIG. 4.

FIG. 6 illustrates an embodiment of a transceiver including the optical receiver 400 according to the first embodiment.

The transceiver 600 includes a dielectric non-conductive substrate (not shown), a ground plane 601 positioned on the dielectric non-conductive substrate, an array of four drivers 602, an array of four laser diodes (VCSEL) 603 connected to respective outputs of the drivers of the array of drivers 602, and an optical receiver 650. In FIG. 6, the optical receiver 650 is encircled with the dotted line 651. As the structure of the optical receiver 650 is identical to the optical receiver 400 of the first embodiment. The array of drivers 602, the array of laser diodes 603, and the optical receivers 650 are all positioned on the dielectric non-conductive substrate.

Each driver of the driver array 602 has inputs (not shown) that receive an electrical signal from a motherboard of a computer (not shown), converts the received electrical signal into a single ended electrical signal, and outputs this single ended electrical signal through output terminals 610 and 611 to inputs of a laser diode of the array of laser diodes 603. The output terminal 611 of a driver of the driver array 602 is connected through a ground line 613 to an input of a respective laser diode of the array of laser diodes 603. The output terminal 610 of a driver of the driver array 602 is connected through a signal line 612 to another input of the respective laser diode. Each laser diode of the array of laser diodes 603 converts the single ended electrical signal received at the input to an optical signal, and outputs this optical signal into an optical fibre.

Since each opening 615 positioned in the ground plane 601 of the transceiver 600 has a resonance frequency that is higher than 3 times of the fundamental frequency corresponding to the 25 Gbps data communication, none of the openings 615 exhibits a resonance effect at 38 GHz, and consequently, do not attract current from the Driver-VCSEL channels of the transceiver 600. Therefore, crosstalk in the PIN-TIA channels of the optical receiver 615 is reduced to a tolerable value.

Figure 7:
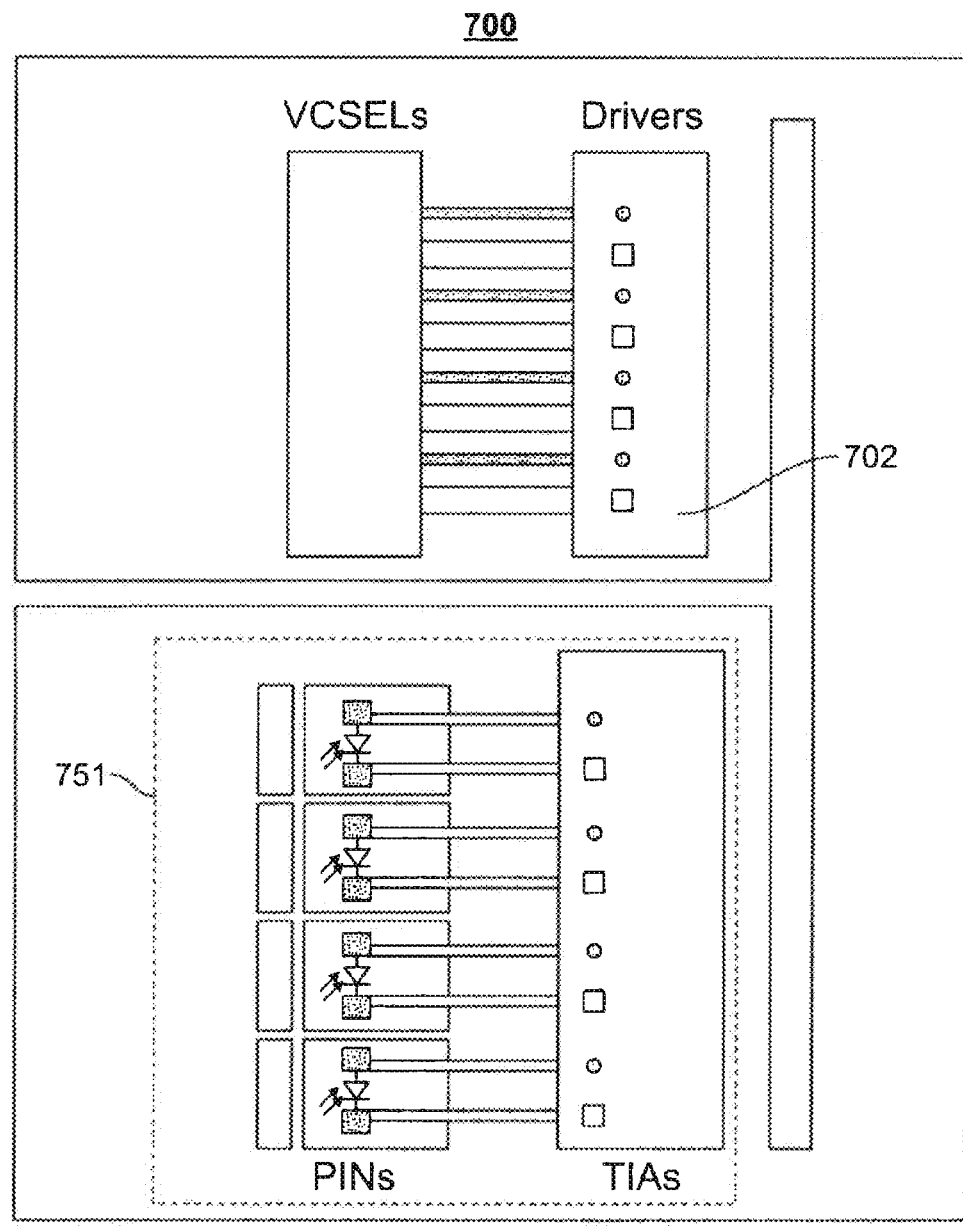
FIG. 7 shows a schematic of a transceiver having the optical receiver of FIG. 5.

FIG. 7 illustrates an embodiment a transceiver 700 including the optical receiver 500 according to the second embodiment instead of the optical receiver 400 according to the first embodiment as shown in FIG. 6. The optical receiver 500 of the second embodiment is encircled by the dotted line 751.

Since the optical receiver 500 of the second embodiment reduces crosstalk in the PIN-TIA channels even more efficiently than the optical receiver 400 of the first embodiment, the transceiver 700 reduces crosstalk from the Driver-VCSEL channels into the PIN-TIA channels even more efficiently than the transceiver 600.

In the transceivers 600 and 700, the fundamental frequency of the single ended electrical signals output by the drivers of the array of drivers 602, which corresponds to the fundamental frequency of the signal to be transmitted, is identical to the fundamental frequency of the optical signals received at the photodiodes of the optical receiver. In the case of a 25 Gbps data communication, the fundamental frequency of the signals to be transmitted/received is 12.5 GHz. However, the present invention is not limited to 12.5 GHz, but is also applicable to other fundamental frequencies of the signals to be transmitted/received by adjusting the dimensions of the openings 415, 515 and 525 accordingly.

A transceiver according to the present invention is not limited to cases where the fundamental frequency of the signals to be transmitted is identical to the fundamental frequency of the signals to be received. On the contrary, one of ordinary skill in the art would understand that the fundamental frequency of the signals to be transmitted can be different from the fundamental frequency of the signals to be received.

Figure 8:
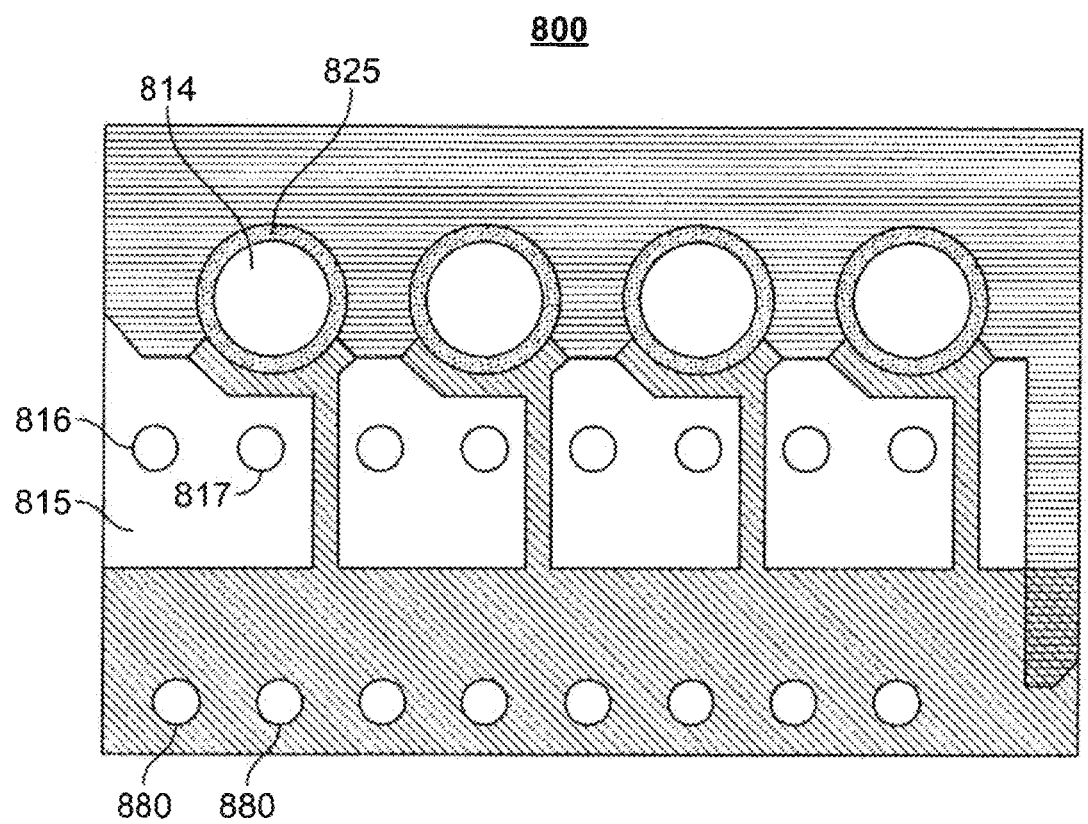
FIG. 8 shows a layout of a mask of the optical receiver of FIG. 5

FIG. 8 shows a layout/design 800 of a mask for an optical receiver 500 illustrated in FIG. 5. Reference numeral 814 denotes a PIN diode corresponding to the photodiode 514 in FIG. 5. Reference numerals 816 and 817 denote the cathode and the anode of the PIN diode 814. Reference numeral 880 denotes the inputs of the TIA connected with the PIN diode 812. The TIAs and the connection lines with the PIN diodes are not shown in FIG. 8. Reference numeral 815 denotes a first opening corresponding to the first opening 515 in FIG. 5. Reference numeral 825 denotes a second opening corresponding to the second opening 525 in FIG. 5. The horizontal and oblique-regions in FIG. 8 represent ground planes corresponding to the ground plane 501 in FIG. 5.

Figure 2:
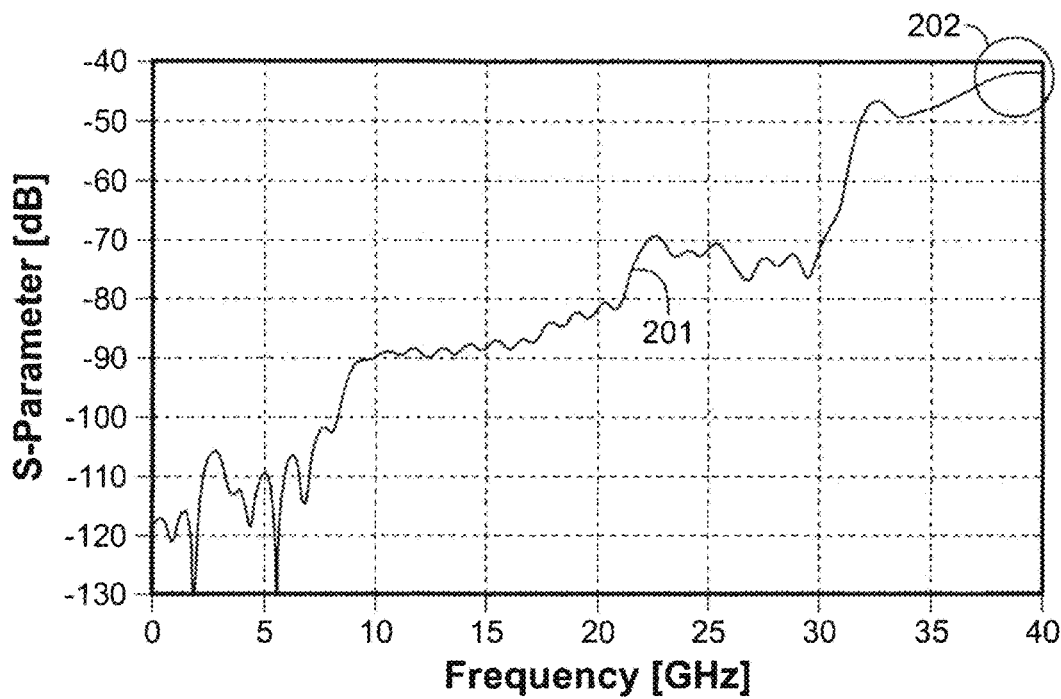
FIG. 2 shows the principle s-parameter coupling coefficient corresponding to the single end type crosstalk from the driver outputs to the input of the TIA closest to the driver array for the conventional transceiver.
Figure 3:
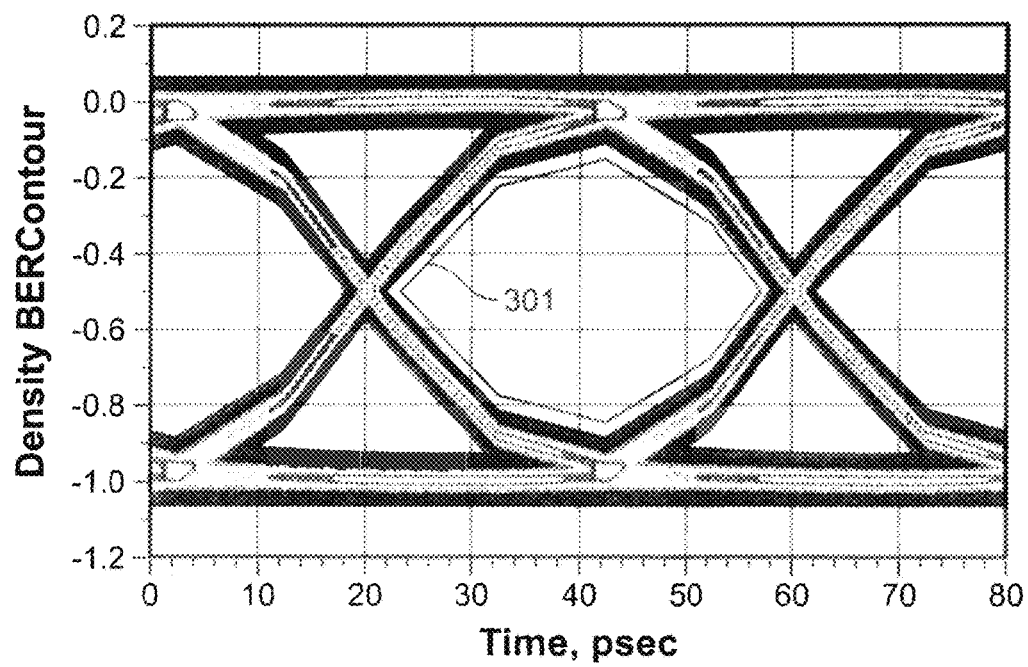
FIG. 3 shows the EYE diagram corresponding to 25 Gbps for the PIN-TIA channel closest to the driver array in the conventional transceiver.
Figure 9:
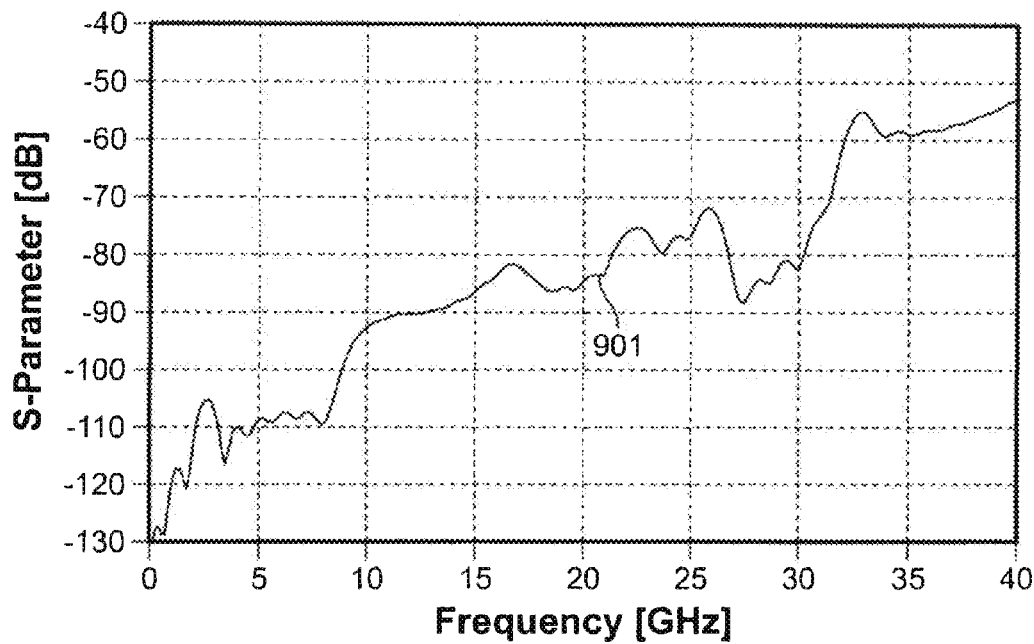
FIG. 9 shows the principle s-parameter coupling coefficient corresponding to the single end type crosstalk from the driver outputs to the input of the TIA closest to the driver array.
Figure 10:
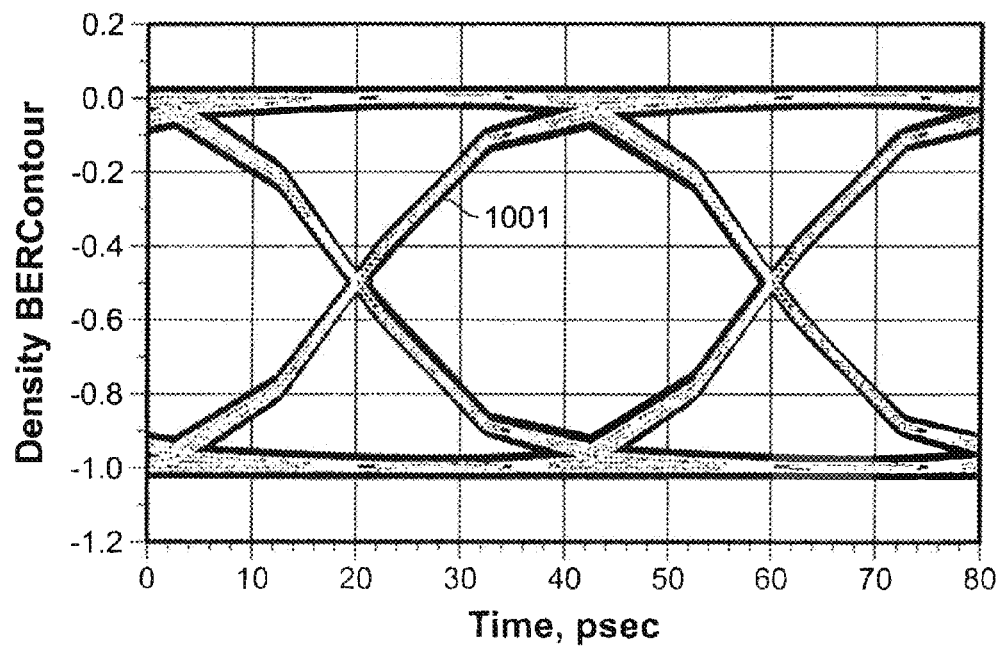
FIG. 10 shows the EYE diagram corresponding to 25 Gbps for the PIN-TIA channel closest to the driver array in the transceiver including the optical receiver.

FIG. 9 shows the principle s-parameter coupling coefficient corresponding to the single end type crosstalk from the driver outputs of the driver array 702 to the input of the TIA that is closest to the driver array 702. This is obtained by simulation for the transceiver 700 having all Driver-VCSEL channels activated. The principle s-parameter coupling coefficient 901 does not show a broad resonance at 37.5 GHz. On the contrary, the principle s-parameter coupling coefficient's 901 level at about 37.5 GHz is reduced by 15 dB as compared to FIG. 2. Hence, crosstalk in the TIA input closest to the driver array 102 is significantly reduced. This becomes also evident from FIG. 10, which shows the EYE diagram corresponding to 25 Gbps, for the PIN-TIA channel closest to the driver array 702. The crosstalk in the PIN-TIA channel closest to the driver array 702 generates less than 2 ps or 0.05 UI Jitter in the EYE diagram for 25 Gbps, assuming a bit error rate (BER) of $10^{-12}$. The outline 1001 corresponds to a bit error rate of $10^{-12}$. The EYE diagram in FIG. 10 has been obtained by simulation under similar conditions as the EYE diagram in FIG. 2, i.e. the transceiver 100 has all four aggressor channels activated and the ratio between driver output and TIA input current is equal to 100, which corresponds to about −8 dBm optical receiver sensitivity.

Although the optical receivers shown in FIGS. 4 and 5 have four PIN-TIA channels, the present invention is not limited to optical receivers with four PIN-TIA channels, but is also applicable to optical receivers having an up to four, or greater than four PIN-TIA channels.

Although the transceivers shown in FIGS. 6 and 7 have four Driver-VCSEL channels and four PIN-TIA channels, the present invention is not limited to transceivers with four Driver-VCSEL channels and four PIN-TIA channels, but is also applicable to transceivers having an up to four and greater than four Driver-VCSEL channels and up to four or greater than four PIN-TIA channels.

Although the openings provided in the ground planes of the optical receivers according to the first and second embodiments have a rectangular shape, the present invention is not limited to openings having a rectangular shape, but is also applicable to openings having a circular shape, an oval shape, a rhombic shape, or any other shape. The shape can we a wide variety of shapes, so long as the resonance frequency of the openings is higher than three times the fundamental frequency of the signal that induces crosstalk in the PIN-TIA channel.

What is claimed is:

1. An optical receiver comprising:
a dielectric substrate;
a ground plane positioned on the dielectric substrate;
a photodiode positioned on the dielectric substrate, receiving an optical signal and having an optical signal input and an electrical signal output;
an electrical signal amplifier having an input connected to the electrical signal output of the photodiode; and
a first opening defined in the around plane, the first opening surrounding the photodiode to isolate the photodiode from the ground plane and the first opening being sized and shaped to have a resonance frequency higher than a signal fundamental frequency such that crosstalk is reduced at the input of the electrical signal amplifier.

2. The optical receiver of claim 1, wherein the resonance frequency is n times the signal fundamental frequency, where n is a positive integer and is greater than three.

3. The optical receiver of claim 2, wherein the resonance frequency is equal to or greater than 50 gigahertz (GHz).

4. The optical receiver of claim 1, wherein the signal fundamental frequency is that of the optical signal.

5. The optical receiver of claim 1, wherein an electrical signal receivable at the input of the electrical signal amplifier is single ended.

6. The optical receiver of claim 1, further comprising a second opening positioned in the ground plane, adjacent to the first opening.

7. The optical receiver of claim 1, wherein a plurality of optical signals of a same fundamental frequency are receivable by the optical receiver having: a plurality of photodiodes positioned on the dielectric substrate; each having a corresponding optical signal input and a corresponding electrical signal output;
a plurality of electrical signal amplifiers, each having a corresponding input connected to a corresponding electrical signal output of a corresponding photodiode; and
a plurality of first openings positioned in the ground plane with each opening surrounding one photodiode, and having a corresponding resonance frequency higher than the signal fundamental frequency, such that a corresponding crosstalk is reduced at the corresponding input of the plurality of electrical signal amplifiers.

8. The optical receiver of claim 7, wherein the signal fundamental frequency is the fundamental frequency of the plurality of optical signals.

9. The optical receiver of claim 7, wherein the plurality of optical signals includes four optical signals, four photodiodes, four electrical signal amplifiers, four first openings, and the signal fundamental frequency of 12.5 gigahertz (GHz).

10. The optical receiver of claim 9, wherein each of the plurality of first openings have a rectangular shape and dimensions of 0.3 millimeter (mm) by 0.25 mm.

11. The optical receiver of claim 9, wherein the plurality of photodiodes or the plurality of electrical signal amplifiers are linearly arranged in an array.

12. The optical receiver of claim 7, further comprising a plurality of second openings positioned in the ground plane, each opening of the plurality of second openings being positioned adjacent to one of the plurality of first openings.

13. The optical receiver of claim 1, wherein data is receivable at a bit rate corresponding to the signal fundamental frequency.

14. A transceiver comprising:
an optical receiver comprising:
a dielectric substrate;
a ground plane positioned on the dielectric substrate;
a photodiode positioned on the dielectric substrate and having an optical signal input and an electrical signal output;
an electrical signal amplifier having an input connected to the electrical signal output of the photodiode; and
a first opening defined in the ground plane, the first opening surrounding the photodiode to isolate the photodiode from the ground plane and the first opening being sized and shaped to have a resonance frequency higher than a signal fundamental frequency such that crosstalk is reduced at the input of the electrical signal amplifier; an optical transmitter comprising:
a laser diode positioned in the first opening of the optical receiver, and having a single ended electrical signal input and an optical signal output; and
a driver having a single ended electrical signal output of the signal fundamental frequency that is connected to the single ended electrical signal input of the laser diode.

15. A transceiver comprising:
an optical receiver comprising:
a plurality of photodiodes positioned on a substrate, each having an optical signal input and an electrical signal output;
a plurality of electrical signal amplifiers, each having an input connected to the electrical signal output of a corresponding photodiode of the plurality of photodiodes; and
a plurality of first openings defined in a ground plane with each opening surrounding one photodiode of the plurality of photodiodes to isolate the photodiode from the ground plane, and each opening being sized and shaped to have a resonance frequency higher than a signal fundamental frequency, such that a corresponding crosstalk is reduced at a corresponding input of the plurality of electrical signal amplifiers; an optical transmitter comprising:
a plurality of laser diodes, each laser diode having a single ended electrical signal input and an optical signal output; and,
a plurality of drivers, each driver having a single ended electrical signal output of the signal fundamental frequency that is connected to the single ended electrical signal input of the each laser diode.

16. The transceiver of claim 14, further comprising a second opening positioned in the ground plane, adjacent to the first opening.

17. The transceiver of claim 14, wherein the resonance frequency is n times the signal fundamental frequency, where n is a positive integer and is greater than three or is equal to or greater than 50 gigahertz (GHz).

18. The transceiver of claim 15, further comprising a plurality of second openings positioned in the ground plane, each opening being positioned adjacent to one of the plurality of first openings.

19. The transceiver of claim 15, wherein the plurality of photodiodes are linearly arranged in an array.

20. The transceiver of claim 15, wherein the resonance frequency is n times the signal fundamental frequency, where n is a positive integer and is greater than three or is equal to or greater than 50 gigahertz (GHz).

* * * * *